(12) United States Patent
Behrends et al.

(10) Patent No.: US 8,467,230 B2
(45) Date of Patent: Jun. 18, 2013

(54) DATA SECURITY FOR DYNAMIC RANDOM ACCESS MEMORY USING BODY BIAS TO CLEAR DATA AT POWER-UP

(75) Inventors: Derick Gardner Behrends, Rochester, MN (US); Todd Alan Christensen, Rochester, MN (US); Travis Reynold Hebig, Rochester, MN (US); Michael Launsbach, Rochester, MN (US); Daniel Mark Nelson, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 217 days.

(21) Appl. No.: 12/898,924

(22) Filed: Oct. 6, 2010

(65) Prior Publication Data

US 2012/0087176 A1  Apr. 12, 2012

(51) Int. Cl.
*G11C 11/24* (2006.01)
(52) U.S. Cl.
USPC ........... 365/149; 365/218; 365/226; 365/102; 365/186

(58) Field of Classification Search
USPC .......................... 365/149, 218, 226, 102, 186
See application file for complete search history.

(56) References Cited

U.S. PATENT DOCUMENTS

| | | | |
|---|---|---|---|
| 6,515,891 B2 * | 2/2003 | Kronke et al. | 365/145 |
| 2004/0070441 A1 * | 4/2004 | Bringivijayaraghavan | 327/534 |
| 2007/0230246 A1 * | 10/2007 | Umezawa et al. | 365/185.09 |
| 2010/0327954 A1 * | 12/2010 | Sakamoto et al. | 327/519 |

* cited by examiner

*Primary Examiner* — Fernando Hidalgo
(74) *Attorney, Agent, or Firm* — Martin & Associates, LLC; Bret J. Petersen

(57) ABSTRACT

A circuit and method erase at power-up all data stored in a DRAM chip for increased data security. All the DRAM memory cells are erased by turning on the transistors for the DRAM storage cells simultaneously by increasing the body voltage of cells. In the example circuit, the body voltage is increased by a charge pump controlled by a power-on-reset (POR) signal applying a voltage to the p-well of the memory cells. The added voltage to the p-well lowers the threshold voltage of the cell, such that the NFET transistor of the memory cell will turn on. With all the devices turned on, the data stored in the memory cells is erased as the voltage of all the cells connected to a common bitline coalesce to a single value.

6 Claims, 3 Drawing Sheets

DATA SECURITY FOR DYNAMIC RANDOM ACCESS MEMORY USING BODY BIAS TO CLEAR DATA AT POWER-UP

BACKGROUND

1. Technical Field

This disclosure generally relates to data security and dynamic random access memory (DRAM), and more specifically relates to providing data security for data stored in a DRAM by using body bias to clear any persistent data on power up of the DRAM chip.

2. Background Art

It has been shown that traditional DRAM chips such as those used for memory in computer laptops and other electronic devices have security issues. While it is commonly thought that the data on a DRAM chip is no longer available after powering down the chip, actually the data on the chip is persistent such that the data may still be available after power is turned off. The data, stored as a charge on a capacitor, is still available because the charge on the individual DRAM capacitors leaks off very slowly. In addition, the leak off time can be dramatically increased by chilling the DRAM device. An intruder could possibly obtain access to secure information in the DRAM.

Computer laptops or other portable computer devices are particularly vulnerable to theft of data in DRAM memory. An intruder with physical access to a laptop could potentially read all the data stored in memory even if the laptop has been powered down or placed in a password protected state such as a hibernate mode. In one scenario, this form of data theft is accomplished by powering down a laptop, and then booting it from an external drive, which runs a program that copies the entire contents of the DRAM onto this external drive. The copied data from the memory can then be mined for important data such as security keys or encryption keys. The security keys could then be used to gain access to sensitive/classified/restricted data on the hard drive that would not be available without the security keys.

BRIEF SUMMARY

The disclosure is directed to a circuit and method for erasing at power-up all data stored in a DRAM chip for increased data security. All the DRAM memory cells are erased by turning on the transistors for the DRAM storage cells simultaneously by increasing the body voltage of cells. In the example circuit, the body voltage is increased by a charge pump controlled by a power-on-reset (POR) signal applying a voltage to the p-well of the memory cells. The added voltage to the p-well lowers the threshold voltage of the NFET transistor of the memory cell, such that the transistor of the memory cell will turn on. With all the devices turned on, the data stored in the memory cells is erased as the voltage of all the cells connected to a common bitline coalesce to a single value.

The foregoing and other features and advantages will be apparent from the following more particular description, as illustrated in the accompanying drawings.

BRIEF DESCRIPTION OF THE SEVERAL VIEWS OF THE DRAWING(S)

The disclosure will be described in conjunction with the appended drawings, where like designations denote like elements, and:

DETAILED DESCRIPTION

Described herein is an apparatus and method for erasing at power-up all data stored in a DRAM chip for increased data security. All the DRAM memory cells are erased by turning on the transistors for the DRAM storage cells simultaneously by increasing the body voltage of cells. In the example circuit, the body voltage is increased by a charge pump controlled by a power-on-reset (POR) signal applying a voltage to the p-well of the memory cells. The added voltage to the p-well lowers the threshold voltage of the NFET transistor of the memory cell, such that the transistor will turn on. With all the devices turned on, the data stored in the memory cells is erased as the voltage of all the cells connected to a common bitline coalesce to a single value.

Figure 1:
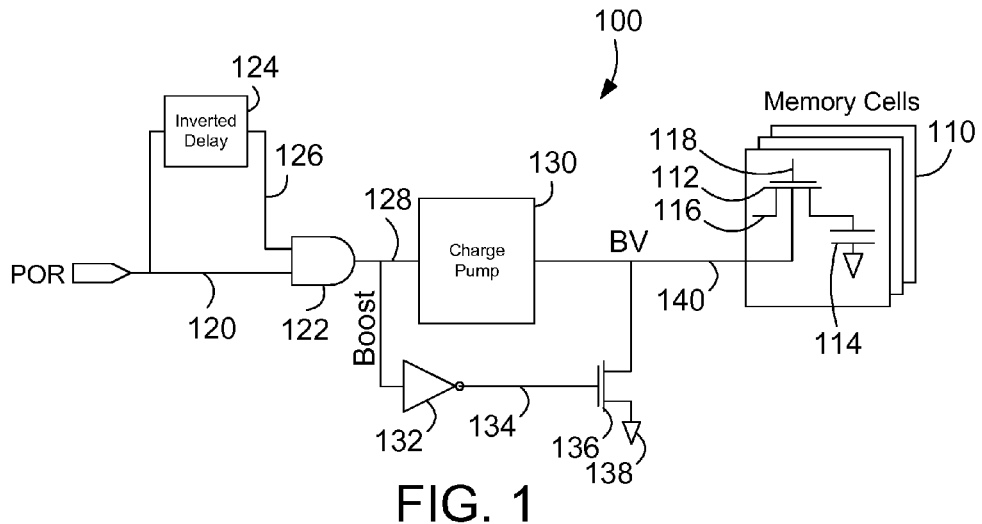
FIG. 1 is a circuit for erasing a DRAM memory at power up for increased security of DRAM memory.

FIG. 1 is an example circuit 100 for erasing DRAM memory cells 110 at power up for increased security of DRAM memory. A DRAM memory is typically made of many memory cells 110 with a cell for each bit of the memory. The DRAM memory cells 110 are preferably arranged in an array as described below. The DRAM memory cells 110 used as an example herein are N-type Field Effect Transistors (NFETs) paired with a capacitor in a complementary metal-oxide semiconductor (CMOS) device as know in the prior art. In the illustrated example, the DRAM memory cells 110 include an NFET transistor 112 for storing a charge on a capacitor 114. The level stored on the capacitor 114 depends on the logic level supplied by a Bitline 116 when activated by a Wordline 118. The circuit 100 clears or erases the data stored in the DRAM memory cells 110 at power up by turning on the memory cell NFETs 112 at the same time.

The circuit 100 in FIG. 1 has a POR signal 120 that initiates erasing the memory cells 110. The POR signal 120 is preferably generated on chip to increase security. Methods and circuits for generating a POR signal in response to energization of an integrated circuit by a power supply are known in the prior art. In the example circuit 100 shown in FIG. 1, the POR signal 120 rises to a high logic level at power-up of the integrated circuit containing the circuit 100. The POR signal 120 is used to generate a boost to the body voltage of the memory cell transistor for a time period sufficient to erase the memory cells as described below. The POR signal 120 is connected to an AND gate 122 and to an inverted delay circuit 124. The output 126 of the inverted delay circuit 124 is connected to another input of the AND gate 122. The inverted delay circuit 124 provides a delay from the rising edge of the POR signal 120 and then turns off the AND gate 122 by going low after a time determined by the inverted delay circuit 124. The inverted delay circuit 124 is constructed to provide a time period or delay in response to the POR that is sufficient in length for the memory cells to all discharge to erase the memory contents as described below. The inverted delay circuit 124 may be constructed in any suitable manner, including those known in the prior art or developed in the future.

Again referring to FIG. 1, the AND gate 122 outputs a Boost signal 128 to control a charge pump 130 to provide a boosted body voltage at node BV 140 as described below. The Boost signal 128 is also connected to an inverter 132. The Boost signal 128 goes to logic high level for a length of time determined by the inverted delay circuit 124 described above. The inverted Boost signal 134 at the output of inverter 132 turns off the reference tie transistor 136. Turning off reference tie transistor 136 disconnects the body voltage (BV) node 140 from a reference node, referred to herein as ground reference 138. BV 140 is connected to the body of the memory cells 110 to provide a body voltage for the transistors of the memory cells. For memory cells constructed with NFET transistors and capacitors as shown, the body is a p-well as described below. The p-well is normally held to ground reference 138 and then is disconnected from the ground reference 138 by inverted Boost signal 134. Boost 128 is connected to charge pump 130 so that when Boost 128 is high, the charge pump 130 provides a boosted voltage level to BV 140. The boosted body voltage from the charge pump is connected to the P-well that contains all the NFET devices of the DRAM cells. The boosted body voltage on the NFETS lowers the threshold voltage and forces the DRAM cell NFETs to conduct despite the value on the wordline at the gate of the NFET. With all the NFETS turned on, the memory cell capacitors 114 with a common bit line 116 are all connected together so that the charge on the memory cell capacitors coalesce to a common voltage thereby clearing the data contents of the DRAM capacitors. During functional mode, BV 140 is not driven by the charge pump 130 and is connected to ground reference 138 through transistor 136 for normal DRAM operation.

As introduced above, the charge pump 130 provides a boosted voltage on node BV 140 to provide a boosted body voltage to the DRAM memory cells 110. The boosted voltage provided by charge pump 130 is sufficient to lower the turn-on threshold of the memory devices. The actual value of the charge pump 130 would depend on the technology of the DRAM memory cell. For example, for a DRAM memory device using 45 nm technology, the boosted voltage may be in the range of 0.75 to 0.85 volts. In general the boost voltage is some amount greater than the threshold voltage and sufficient to turn on the device. The charge pump 130 may be constructed in any suitable manner, including those known in the prior art or developed in the future.

Figure 2:
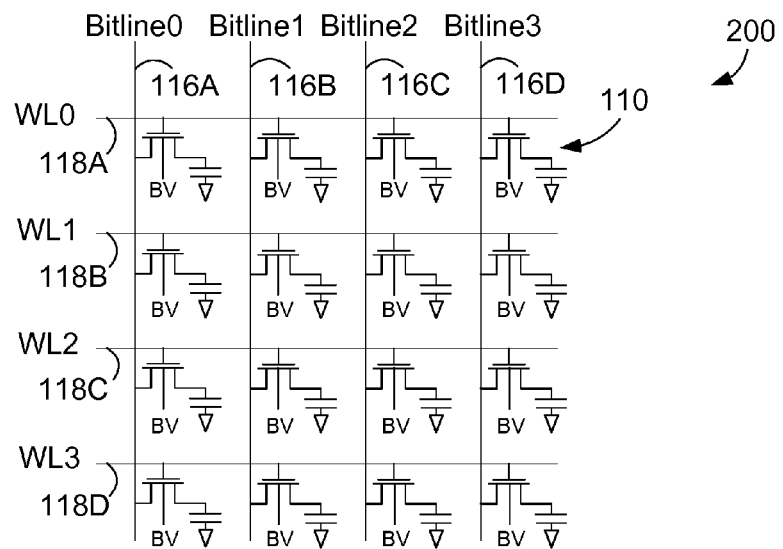
FIG. 2 is a schematic diagram that represents a portion of a DRAM memory with multiple memory cells that are connected to the circuit shown in FIG. 1 which erases the data stored in the memory cells at power up.

FIG. 2 is a schematic diagram that represents a portion of a DRAM memory with multiple memory cells that are connected to the circuit shown in FIG. 1 which erases the data stored in the memory cells at power up. The DRAM memory comprises an array 200 of memory cells 110 as described above. The memory cells 110 in the array are connected by a number of bitlines and wordlines. In the abbreviated example shown in FIG. 2, there are four bitlines 116A-116D (Bitline0 through Bitline3) and four wordlines 118A-118D (WL0-WL3). The body of each of the memory cells 110 in the array 200 are connected to node BV 140 and driven by the circuit described above with reference to FIG. 1.

Figure 3:
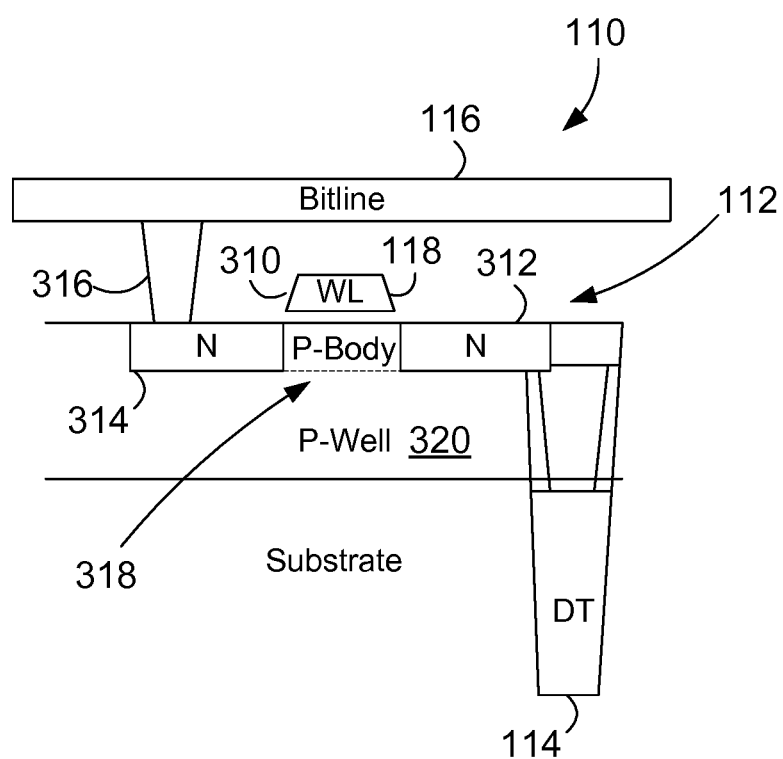
FIG. 3 illustrates a block diagram of the cross section of a DRAM memory cell.

FIG. 3 illustrates the cross section of an NFET DRAM memory cell 110 as described above. The memory cell 110 is an example of a memory cell that can be used in conjunction with circuit 100 described above. The memory cell 110 is essentially a prior art NFET DRAM memory cell that is connected to the circuit 100 in FIG. 1 to provide the body voltage as discussed above. Other technology memory cells, either known or developed in the future, could be substituted for the memory cell shown. The memory cell 110 includes an NFET 112 with the gate 310 tied to the wordline (WL) 118 as described above. The source terminal 312 is tied to the memory cell capacitor 114 (also shown in FIG. 1). In this example, the capacitor is a deep trench capacitor as known in the art. The bit line 116 is connected to drain 314 with a via 316. The NFET 112 has a p-doped transistor body or p-body 318. The NFET 112 sits in a p-well (p-doped well) 320 that is electrically connected to the p-body 318. The p-well 320 is connected to the circuit 100 shown in FIG. 1, meaning that the p-well 318 is part of the node BV 140 described above connected to the charge pump 130 and the drain of NFET 136.

Figure 4:
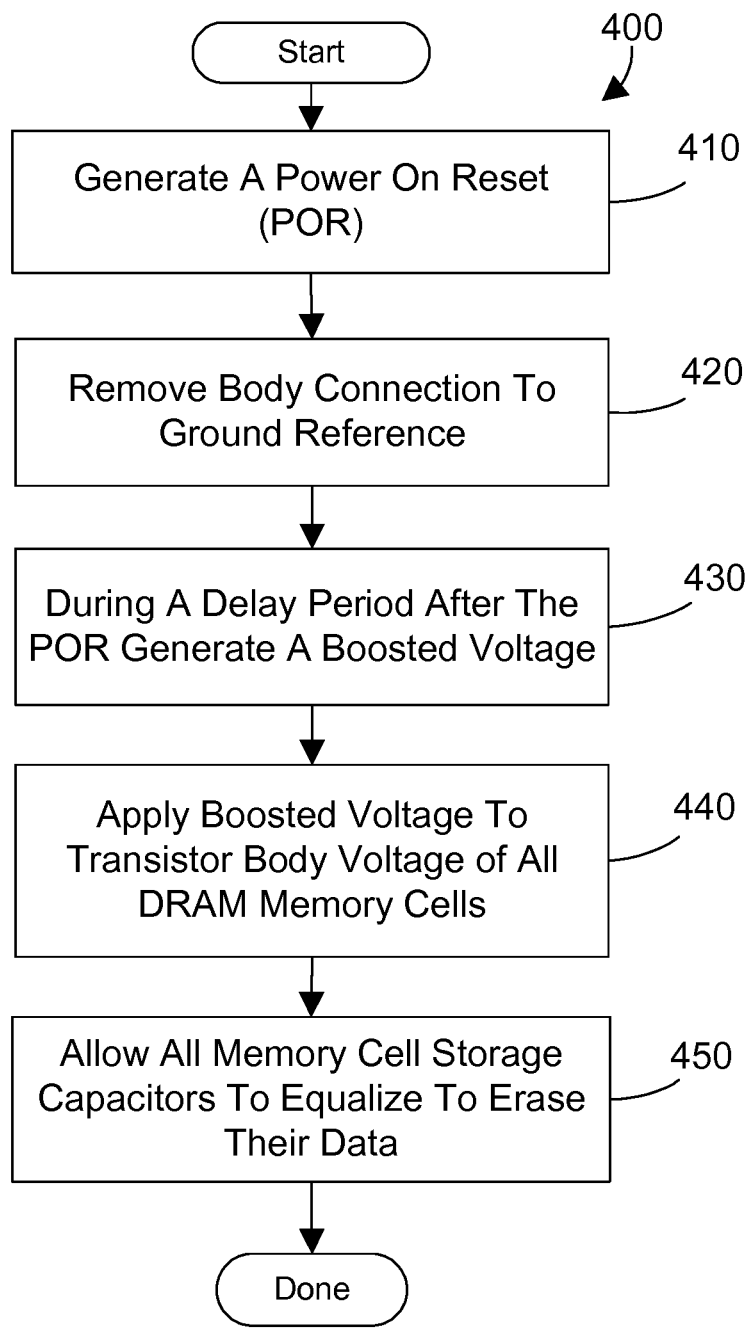
FIG. 4 is a method flow diagram for clearing a DRAM memory at power up.

FIG. 4 shows a method 400 for clearing a DRAM memory at power up as claimed herein. First, generate a POR signal (step 410). Next, remove the body voltage connection (p-well tie) to ground reference (step 420). Then, during a delay period after POR generate a boosted voltage (step 430), apply the boosted voltage to the transistor body of all DRAM memory cell transistors to turn on the transistors (step 440) and allow the memory storage cell capacitors to equalize and clear or erase the data stored on the memory cells (step 450). The method is then done.

One skilled in the art will appreciate that many variations are possible within the scope of the claims. While the examples herein are described in terms of time, these other types of thresholds are expressly intended to be included within the scope of the claims. Thus, while the disclosure is particularly shown and described above, it will be understood by those skilled in the art that these and other changes in form and details may be made therein without departing from the spirit and scope of the claims.

The invention claimed is:

1. An electronic circuit comprising:
   a plurality of memory cells having a capacitor for storing data and a transistor with a body,
   wherein the transistor is connected to a bitline and a wordline;
   wherein a boosted voltage is supplied during a power up period of a device containing the electronic circuit to the body of the transistor in the plurality of memory cells to turn on the transistor and coalesce a voltage stored on the capacitors of all memory cells connected to a common bit line; and
   a body tie transistor that responds to a boost signal to remove a connection between the body of the transistor and a reference voltage to allow the charge pump to provide the boosted voltage to the body of the transistor.

2. The electronic circuit of claim 1 further comprising a power on reset (POR) signal connected to a delay circuit that together provide a boost signal for a delay period after power-up of the electronic circuit to boost the voltage to the body of the transistor.

3. The electronic circuit of claim 2 wherein the POR is generated on an integrated circuit containing the electronic circuit.

4. The electronic circuit of claim 1 wherein each of the plurality of memory cells is a DRAM memory cell with a N-type Field Effect Transistor (NFET).

5. The electronic circuit of claim 1 wherein the boosted voltage is provided by a charge pump.

6. An electronic circuit comprising:
   a plurality of DRAM memory cells having a capacitor for storing data and a NFET transistor with a body, wherein the NFET transistor is connected to a bitline and a wordline;
   a power on reset (POR) signal generated on a chip containing the electronic circuit and connected to a delay circuit that together provide a boost signal for a delay period after power-up of the electronic circuit;

a charge pump that provides a boosted voltage to the body of the transistor during the delay period in the plurality of memory cells to turn on the transistor and equalize a voltage stored on the capacitors of all memory cells connected to a common bit line; and a body tie transistor that responds to the boost signal to remove a connection between the body of the transistor and a reference voltage to allow the charge pump to provide the boosted voltage to the body of the transistor.

* * * * *